US009450171B2

(12) United States Patent
Xiong et al.

(10) Patent No.: US 9,450,171 B2
(45) Date of Patent: Sep. 20, 2016

(54) THIN FILM PIEZOELECTRIC ELEMENT AND MANUFACTURING METHOD THEREOF, MICRO-ACTUATOR, HEAD GIMBAL ASSEMBLY AND DISK DRIVE UNIT WITH THE SAME

(71) Applicant: SAE Magnetics (H.K.) Ltd., Hong Kong (CN)

(72) Inventors: Wei Xiong, Hong Kong (CN); Panjalak Rokrakthong, Hong Kong (CN); Kenjiro Hata, Hong Kong (CN); Kazushi Nishiyama, Hong Kong (CN); Daisuke Iitsuka, Hong Kong (CN); Atsushi Iijima, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 0 days.

(21) Appl. No.: 13/853,403

(22) Filed: Mar. 29, 2013

(65) Prior Publication Data

US 2013/0279042 A1   Oct. 24, 2013

(30) Foreign Application Priority Data

Apr. 19, 2012   (CN) .......................... 2012 1 0116510

(51) Int. Cl.
| | |
|---|---|
| *H01L 41/18* | (2006.01) |
| *H01L 41/12* | (2006.01) |
| *G11B 21/16* | (2006.01) |
| *H01L 41/297* | (2013.01) |
| *H01L 41/08* | (2006.01) |
| *H01L 41/187* | (2006.01) |
| *H01L 41/316* | (2013.01) |

(52) U.S. Cl.
CPC .............. *H01L 41/18* (2013.01); *G11B 5/483* (2015.09); *G11B 21/16* (2013.01); *H01L 41/0805* (2013.01); *H01L 41/1876* (2013.01); *H01L 41/297* (2013.01); *H01L 41/316* (2013.01)

(58) Field of Classification Search
None
See application file for complete search history.

(56) References Cited

U.S. PATENT DOCUMENTS

| | | | | |
|---|---|---|---|---|
| 5,118,982 | A * | 6/1992 | Inoue et al. .................. 310/366 |
| 7,089,637 | B2 * | 8/2006 | Ikeda et al. ................... 29/25.35 |
| 7,229,662 | B2 * | 6/2007 | Wang ................... C23C 18/1216 427/100 |
| 7,984,977 | B2 * | 7/2011 | Takeda ................ H01L 41/1876 117/7 |
| 8,715,823 | B2 * | 5/2014 | Kubota et al. ................ 428/336 |
| 2004/0207288 | A1 * | 10/2004 | Funakubo ............... C30B 25/02 310/311 |
| 2005/0189849 | A1 * | 9/2005 | Ifuku .................... B41J 2/14233 310/358 |
| 2005/0219793 | A1 * | 10/2005 | Matsuda ............. B41J 2/14233 361/321.2 |
| 2005/0275696 | A1 * | 12/2005 | Miyazawa et al. ............. 347/72 |
| 2006/0049135 | A1 * | 3/2006 | Okabe ...................... B41J 2/161 216/27 |
| 2007/0046153 | A1 * | 3/2007 | Matsuda .................. B41J 2/161 310/358 |
| 2007/0215715 | A1 * | 9/2007 | Fukui ................... B41J 2/14233 239/102.2 |
| 2009/0038130 | A1 * | 2/2009 | Cooke et al. ................ 29/25.35 |
| 2009/0230346 | A1 * | 9/2009 | Hamada et al. ........ 252/62.9 PZ |
| 2010/0245487 | A1 * | 9/2010 | Sumi .................... B41J 2/14233 347/68 |

(Continued)

*Primary Examiner* — Kevin Bernatz
(74) *Attorney, Agent, or Firm* — Nixon & Vanderhye PC

(57) ABSTRACT

A thin film piezoelectric element of the present invention includes a substrate and a piezoelectric thin film stack formed on the substrate. The piezoelectric thin film stack includes a top electrode layer, a bottom electrode layer and a piezoelectric layer sandwiched between the top electrode layer and the bottom electrode layer, wherein the piezoelectric layer includes a first piezoelectric layer and a second piezoelectric layer whose compositions have different phase structures. The present invention can obtain high piezoelectric constants, enhanced coercive field strength and good thermal stability, thereby enabling larger applied field strength without depolarization and achieving a large stroke for its applied device.

36 Claims, 7 Drawing Sheets

(56) References Cited

U.S. PATENT DOCUMENTS

| | | | |
|---|---|---|---|
| 2010/0259854 A1* | 10/2010 | Yao et al. ................... | 360/294.4 |
| 2011/0121096 A1* | 5/2011 | Nihei et al. ................. | 239/102.2 |
| 2011/0128327 A1* | 6/2011 | Kubota ............... | C04B 35/4682 347/68 |
| 2012/0217847 A1* | 8/2012 | Nakamura ............ | H01L 41/316 310/367 |
| 2013/0279044 A1* | 10/2013 | Xiong ................... | G11B 5/5552 360/99.08 |
| 2014/0265729 A1* | 9/2014 | Murakami ............ | C04B 35/495 310/323.02 |

* cited by examiner

THIN FILM PIEZOELECTRIC ELEMENT AND MANUFACTURING METHOD THEREOF, MICRO-ACTUATOR, HEAD GIMBAL ASSEMBLY AND DISK DRIVE UNIT WITH THE SAME

This application claims priority to Chinese Application No. 201210116510.6 filed Apr. 19, 2012, the entire contents of which is hereby incorporated by reference.

FIELD OF THE INVENTION

The present invention relates to a piezoelectric element, and more particularly, to a thin film piezoelectric element and manufacturing method thereof, a micro-actuator, a head gimbal assembly (HGA), and a disk drive unit with the same.

BACKGROUND OF THE INVENTION

Piezoelectric material is processed into various piezoelectric elements in accordance with different purposes, particularly, it has been widely used for functional electronic components such as an actuator for generating deformation by applying voltage or a sensor for generating voltage from the deformation of elements in a reverse way, etc.

As the piezoelectric material used for an actuator in the disk drive unit for actuating the fine movements of the slider thereof, a lead (Pb)-based dielectric material having large piezoelectric characteristics, especially, Lead Zirconate Titanate $Pb(Zr_{1-x}Ti_x)O_3$-based perovskite-type ferroelectric called as "PZT", has been widely used, and the piezoelectric material is generally formed by sintering oxide which is formed of individual elements.

Crystal structure of this piezoelectric material formed of PZT varies with the ratio of $PbTiO_3/PbZrO_3$. FIG. 1a shows a phase diagram of the PZT. Curie Temperature Tc is a boundary of high-temperature cubic paraelectric phase (Pc) and low-temperature ferroelectric phase. And a morphotropic phase boundary (MPB) divides the ferroelectric phase region into two regions including a tetragonal phase region ($F_T$) and a rhombohedra phase region ($F_R$). As known, when the crystal structure is located at the MPB, the free energy of the spontaneous polarization is quite high, thus this PZT has the best electromechanical conversion property and the best piezoelectric property to obtain an excellent piezoelectric constant d31 or d33.

However, it's quite hard to control the composition exactly located at the MPB. Thus a conventional thin film piezoelectric element often applies the composition near the MPB, such as $Pb(Zr_{0.52}Ti_{0.48})O_3$ or $Pb(Zr_{0.58}Ti_{0.42})O_3$. As shown in FIG. 1b, the conventional thin film piezoelectric element 100 includes a substrate 101, two electrode layers 102, 103 formed on the substrate 101, and a piezoelectric layer 104 sandwiched between the two electrode layers 102, 103. The layers 102, 103, 104 are typically deposited by sputtering, laser ablation, Sol-gel coating, and various chemical vapor deposition (CVD) or molecular chemical vapor deposition (MOCVD). Concretely, the substrate 101 is made by Si or other materials such as MgO, etc., and the electrode layers 102, 103 are made by Pt, or conductive oxide SrRuO (SRO), or their combinations, or other conductive materials. Conventionally, the piezoelectric layer 104 includes composition near the MPB, whose crystal structure is tetragonal phase structure or rhombohedra phase structure. And the single-phase piezoelectric layer 104 has a thickness about 2 μm.

However, the piezoelectric constants of this single-phase piezoelectric element 100 is still inadequate as the product requirement for stroke becomes higher and higher. Moreover, the applied field strength is limited due to the single phase structure wherein the depolarization will occur at field strength larger than the coercive field strength (Ec). Conventionally, one way to enable larger applied field strength is to increase the coercive field strength by coercive imprinting which relates to apply a large stress on the piezoelectric element. However, it will bring high risk of delamination and reliability failure for the piezoelectric element. Another way to enable larger applied field strength is to increase the PZT thickness, which will cause a rise in the cost however. Based on the limitation on the piezoelectric constants and coercive field strength, the stroke of the piezoelectric element applied in the actuator or sensor is insufficient, which does not satisfy the requirement of the product manufacturer.

Thus, there is a need for an improved thin film piezoelectric element to overcome the drawbacks mentioned above.

SUMMARY OF THE INVENTION

One aspect of the present invention is to provide a thin film piezoelectric element thereby obtaining high piezoelectric constants, enhanced coercive field strength and good thermal stability, and in turns enabling larger applied field strength without depolarization and achieving a large stroke for its applied device.

Another aspect of the present invention is to provide a manufacturing method of a thin film piezoelectric element thereby obtaining high piezoelectric constants, enhanced coercive field strength and good thermal stability, and in turns enabling larger applied field strength without depolarization and achieving a large stroke for its applied device.

Yet an aspect of the present invention is to provide a micro-actuator with a thin film piezoelectric element, thereby obtaining high piezoelectric constants, enhanced coercive field strength and good thermal stability, and in turns enabling larger applied field strength without depolarization and achieving a large stroke for its applied device.

Still an aspect of the present invention is to provide a head gimbal assembly with a thin film piezoelectric element and good thermal stability, thereby obtaining high piezoelectric constants, enhanced coercive field strength, and in turns enabling larger applied field strength and achieving a large stroke for its applied device.

One more aspect of the present invention is to provide a disk drive unit with a thin film piezoelectric element, thereby obtaining high piezoelectric constants, enhanced applied field strength, good thermal stability and a large stroke for its applied device.

One more aspect of the present invention is to provide a micro-electro-mechanical system with a thin film piezoelectric element, thereby obtaining high piezoelectric constants, enhanced applied field strength, good thermal stability and a large stroke.

To achieve above objectives, a thin film piezoelectric element of the present invention includes a substrate and a piezoelectric thin film stack formed on the substrate. The piezoelectric thin film stack includes a top electrode layer, a bottom electrode layer and a piezoelectric layer sandwiched between the top electrode layer and the bottom electrode layer, wherein the piezoelectric layer includes a first piezoelectric layer and a second piezoelectric layer whose compositions are different and preferably to have different phase structures.

As a preferred embodiment, one of the first piezoelectric layer and the second piezoelectric layer has a rhombohedra phase structure, the other has a tetragonal phase structure.

As another preferred embodiment, one of the first piezoelectric layer and the second piezoelectric layer has composition at a morphotropic phase boundary, the other has a rhombohedra phase structure or a tetragonal phase structure.

Preferably, the piezoelectric layer is made of $Pb(Zr_xTi_{1-x})O_3$.

Preferably, the first piezoelectric layer and the second piezoelectric layer have different Ti concentrations.

Preferably, the first piezoelectric layer and the second piezoelectric layer have a thickness in the range of 0.1 µm~1.5 µm.

As an optional embodiment, the piezoelectric layer comprises $KNaNbO_3$, $LiNbO_3$, $LiTaO_3$, $BaTiO_3$, $PbTiO_3$ or $BaSrTiO_3$.

As an optional embodiment, the piezoelectric layer may include more than two layers with different Ti compositions respectively.

As an optional embodiment, the piezoelectric layer can have either a step difference in Ti composition by two-layer or multilayer deposition or a smooth gradient in Ti composition by special deposition arrangement or post annealing treatment.

A manufacturing method of a thin film piezoelectric element of the present invention includes: providing a substrate; depositing a bottom electrode layer on the substrate; and depositing a piezoelectric layer including a first piezoelectric layer and a second piezoelectric layer on the bottom electrode layer, and a top electrode layer on the piezoelectric layer; wherein the first piezoelectric layer and the second piezoelectric layer have different phase structures.

As a preferred embodiment, one of the first piezoelectric layer and the second piezoelectric layer has a rhombohedra phase structure, the other has a tetragonal phase structure.

As another preferred embodiment, one of the first piezoelectric layer and the second piezoelectric layer has composition at a morphotropic phase boundary, the other has a rhombohedra phase structure or a tetragonal phase structure.

Preferably, the piezoelectric layer is made of $Pb(Zr_xTi_{1-x})O_3$.

Preferably, the first piezoelectric layer and the second piezoelectric layer have different Ti compositions.

Preferably, the first piezoelectric layer and the second piezoelectric layer have a thickness in the range of 0.1 µm~1.5 µm.

As an optional embodiment, the piezoelectric layer comprises $KNaNbO_3$, $LiNbO_3$, $LiTaO_3$, $BaTiO_3$, $PbTiO_3$ or $BaSrTiO_3$.

As an optional embodiment, the piezoelectric layer may include more than two layers with different Ti compositions respectively. As an optional embodiment, the piezoelectric layer can have either a step difference in Ti composition by two-layer or multilayer deposition or a smooth gradient in Ti composition by special deposition arrangement or post annealing treatment.

Accordingly, a micro-actuator of the present invention has a thin film piezoelectric element which includes a substrate; and a piezoelectric thin film stack formed on the substrate. The piezoelectric thin film stack includes a top electrode layer, a bottom electrode layer and a piezoelectric layer sandwiched between the top electrode layer and the bottom electrode layer, wherein the piezoelectric layer includes a first piezoelectric layer and a second piezoelectric layer whose compositions have different phase structures.

A head gimbal assembly of the present invention includes a suspension, a slider supported by the suspension, and a thin film piezoelectric element formed on the suspension for actuating the slider. And the thin film piezoelectric element includes a substrate and a piezoelectric thin film stack formed on the substrate. The piezoelectric thin film stack includes a top electrode layer, a bottom electrode layer and a piezoelectric layer sandwiched between the top electrode layer and the bottom electrode layer, wherein the piezoelectric layer includes a first piezoelectric layer and a second piezoelectric layer whose compositions have different phase structures.

A disk drive unit of the present invention includes a head gimbal assembly; a drive arm to connect with the head gimbal assembly, disks and a spindle motor to spin the disks. Therein the head gimbal assembly includes a suspension, a slider supported by the suspension, and a thin film piezoelectric element formed on the suspension for actuating the slider. And the thin film piezoelectric element includes a substrate and a piezoelectric thin film stack formed on the substrate. The piezoelectric thin film stack includes a top electrode layer, a bottom electrode layer and a piezoelectric layer sandwiched between the top electrode layer and the bottom electrode layer, wherein the piezoelectric layer includes a first piezoelectric layer and a second piezoelectric layer whose compositions have different phase structures.

A micro-electro-mechanical system of the present invention includes a thin film piezoelectric element which includes a substrate and a piezoelectric thin film stack formed on the substrate. The piezoelectric thin film stack includes a top electrode layer, a bottom electrode layer and a piezoelectric layer sandwiched between the top electrode layer and the bottom electrode layer, and the piezoelectric layer includes a first piezoelectric layer and a second piezoelectric layer whose compositions are different and preferably to have different phase structures.

In comparison with the prior art, the present invention provides a thin film piezoelectric element having different phase structures on the compositions of the first and second piezoelectric layers, charge will build up on the two piezoelectric layers when an AC voltage is applied to the thin film piezoelectric element, thereby enhancing coercive field strength of the thin film piezoelectric element, and in turns enabling larger applied field strength without depolarization and enhancing the piezoelectric constants d31 and d33 accordingly. Moreover, the depolarization voltage of the thin film piezoelectric element of the present invention is significantly larger than the conventional thin film piezoelectric element, thereby obtaining a larger stroke, which can be applicable to the larger device that needs large stroke. Furthermore, depoling voltage of the present invention is much stable than that of the conventional thin film piezoelectric element under high temperature or low temperature conditions, and no significant drop appears in the depoling voltage curve, thus larger operation voltage of the thin film piezoelectric element is allowed thereby achieving a larger stroke. Meanwhile, the present invention can achieve good thermal stability under a high temperature condition.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1A:
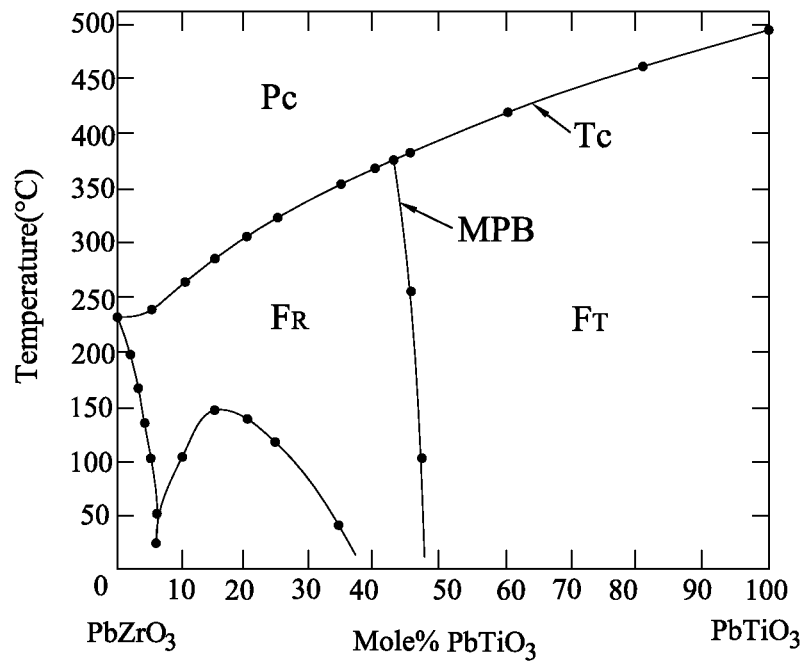
FIG. 1a is a phase diagram of a conventional PZT material.
Figure 1B:
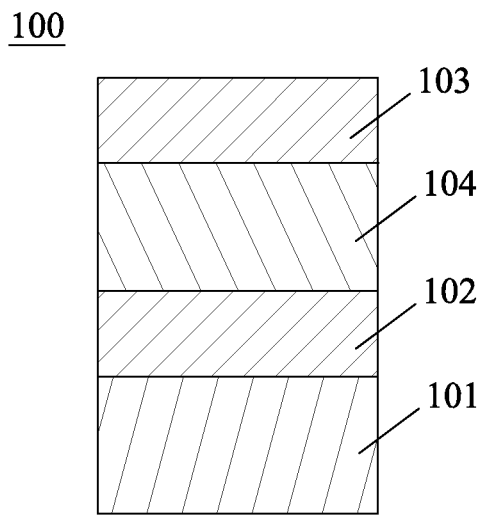
FIG. 1b is a cross-section view of a conventional thin film piezoelectric element.

Various preferred embodiments of the invention will now be described with reference to the figures, wherein like reference numerals designate similar parts throughout the various views. As indicated above, the invention is directed to a thin film piezoelectric element thereby obtaining high piezoelectric constants, enhanced coercive field strength and good thermal stability, and in turns enabling larger applied field strength without depolarization and achieving a large stroke for its applied device.

Figure 2:
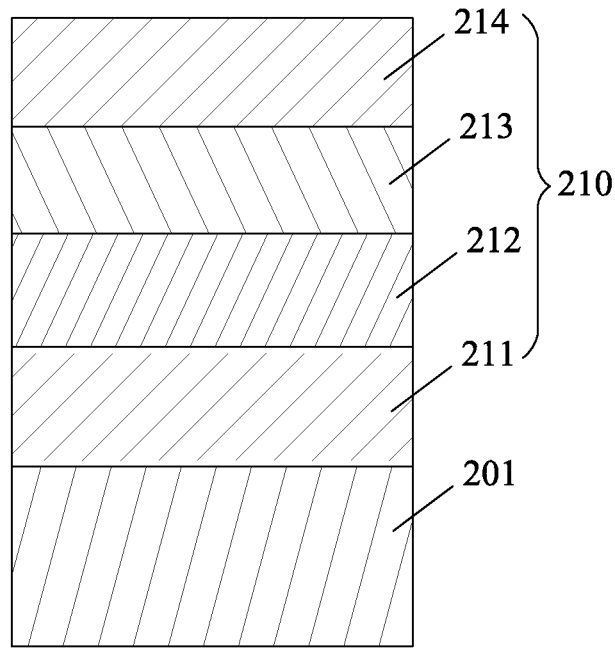
FIG. 2 shows a thin film piezoelectric element according to one embodiment of the present invention.

Referring to FIG. 2, a thin film piezoelectric element 200 according to one embodiment of the present invention includes a substrate 201 and a piezoelectric thin film stack 210 formed on the substrate 201. Concretely, the piezoelectric thin film stack 210 includes a bottom electrode layer 211 formed on the substrate 201, a first piezoelectric layer 212 and a second piezoelectric layer 213 formed on the bottom electrode layer 211 in turn, and a top electrode layer 214 covered thereon. Concretely, the substrate 201 is made by Si or other material such as MgO, etc., and the bottom and top electrode layers 211, 213 are made by Pt or conductive oxide such as SrRuO (SRO) or their combinations, or other conductive materials. And the thickness of the two piezoelectric layers 212, 213 is in the range of 0.1 μm~1.5 μm, and 1 μm is preferred in this embodiment.

Figure 3:
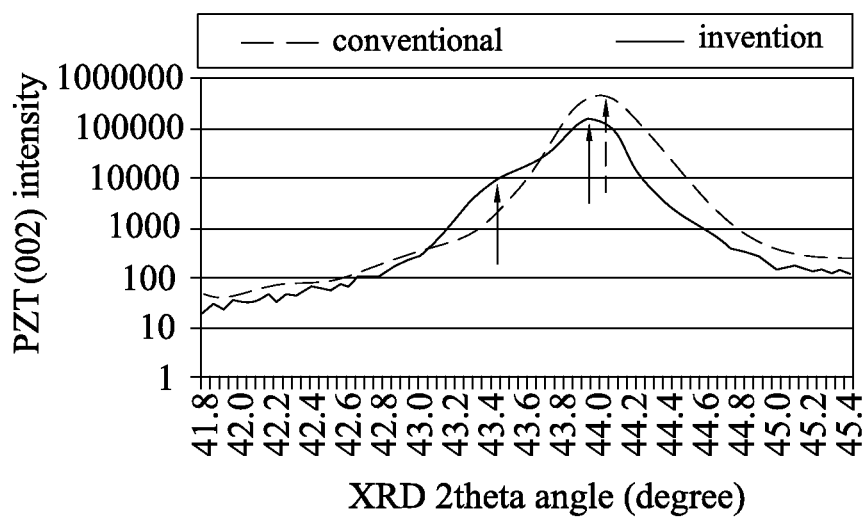
FIG. 3 is a contrast diagram of X-ray diffraction result between the thin film piezoelectric element of the present invention and the conventional thin film piezoelectric element.

In this embodiment, the first piezoelectric layer 212 and the second piezoelectric layer 213 are made by $Pb(Zr_xTi_{1-x})O_3$. As an improvement, the first piezoelectric layer 212 and the second piezoelectric layer 213 have different phase structures. As a preferred embodiment, the first piezoelectric layer 212 has a rhombohedra phase structure, for example its composition is $Pb(Zr_{0.61}Ti_{0.39})O_3$, wherein the ratio of $PbTiO_3/PbZrO_3$ is 0.423 (equivalent to the content of the $PbTiO_3$ is 42.3 mol %); and the second piezoelectric layer 213 has a tetragonal phase structure, for example its composition is $Pb(Zr_{0.58}Ti_{0.42})O_3$, wherein the ratio of $PbTiO_3/PbZrO_3$ is 0.469. In this embodiment, the composition gradient of the ratio is 0.046. Preferably, the composition gradient between two piezoelectric layers 212, 213 is in the range of 0.01~0.90. As shown in FIG. 3 which is an X-ray diffraction (XRD) result curve between the thin film piezoelectric element 200 of the present invention and conventional thin film piezoelectric element 100, the curve of the thin film piezoelectric element 200 of the present invention appears two overlapped peaks (as indicated by the solid arrows), in other words, there are two phase structures existed in the thin film piezoelectric element 200; while the curve of the conventional thin film piezoelectric element 100 appears one peak (as indicated by the dashed arrow) which indicates a single phase structure.

Alternatively, the composition of the first piezoelectric layer 212 has a phase structure in the MPB, and the composition of the second piezoelectric layer 213 has a rhombohedra phase structure or a tetragonal phase structure. In the present invention, the compositions of the first and second piezoelectric layers 212, 213 are not limited, if only their phase structures are different, so as to ensure the thin film piezoelectric element 200 possesses an anisotropic two-phase structure.

As the thin film piezoelectric element 200 has two different phase structures on the compositions of the two piezoelectric layers 212, 213, thus when an AC voltage is applied to the thin film piezoelectric element 200, charge will build up on the two piezoelectric layers 212, 213. Such a charge build up will help to strengthen the domain polarization and enhance the piezoelectric constants d31 and d33. If the composition gradient between the two piezoelectric layers 212, 213 is increased during manufacturing, the charge build up effect becomes much more significant.

As optional embodiment, the piezoelectric thin film stack 210 may further includes a third piezoelectric layer or more, if only the different piezoelectric layers have different compositions, such as different Ti compositions for $Pb(Zr_xTi_{1-x})O_3$ material.

Figure 4A:
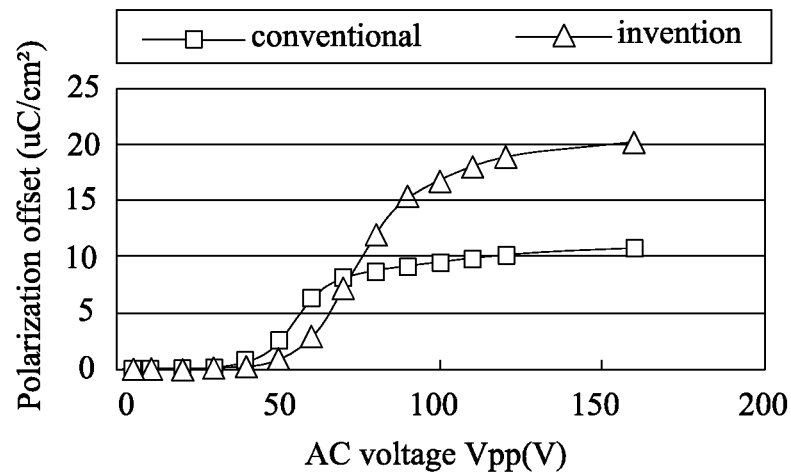
FIG. 4a is a contrast diagram of polarization offset between the thin film piezoelectric element of the present invention and the conventional thin film piezoelectric element under an AC voltage is applied.

FIG. 4a shows a contrast diagram of polarization offset between the thin film piezoelectric element 200 of the present invention and the conventional thin film piezoelectric element 100 under an AC voltage. As the AC voltage increases, the polarization offset of the thin film piezoelectric element 200 of the present invention is increased, which is significantly larger than that of the conventional thin film piezoelectric element 100. Accordingly, the piezoelectric constants d31 and d33 of the thin film piezoelectric element 200 is increased.

Figure 4B:
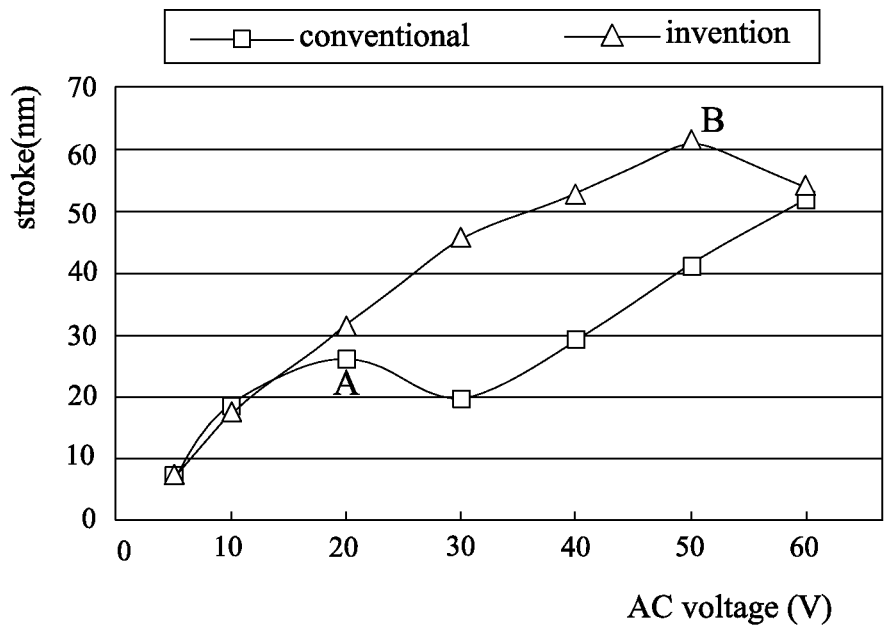
FIG. 4b is a contrast diagram of stroke between the thin film piezoelectric element of the present invention and the conventional thin film piezoelectric element under an AC voltage is applied.

FIG. 4b shows a contrast diagram of stroke between the thin film piezoelectric element 200 of the present invention and the conventional thin film piezoelectric element 100 under an applied AC voltage. As the AC voltage increases, depolarization voltage points A and B of the two thin film piezoelectric elements 100, 200 generate. It can be seen that, the depolarization voltage of the thin film piezoelectric element 200 of the present invention is significantly larger than that of the conventional thin film piezoelectric element 100. As a result, larger operating voltage or larger applied field strength can be applied on the thin film piezoelectric element 200 of the present invention to obtain a larger stroke. As the stroke of the thin film piezoelectric element 200 is increased, thus the thin film piezoelectric element 200 can be applicable to the larger device that needs large stroke.

Figure 4C:
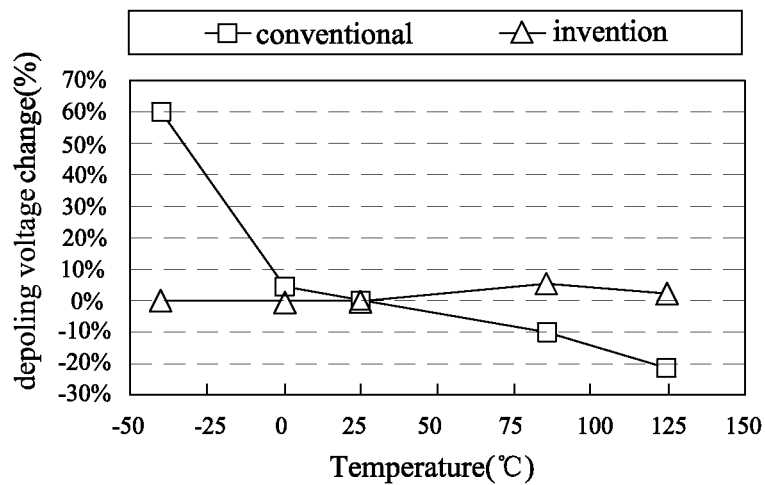
FIG. 4c is a contrast diagram of depoling voltage change between the thin film piezoelectric element of the present invention and the conventional thin film piezoelectric element under a specific temperature range.

FIG. 4c shows a contrast diagram of depoling voltage change between the thin film piezoelectric element 200 of the present invention and the conventional thin film piezoelectric element 100 under a temperature ranging from −40~125° C. about. As the temperature is increased, a significant drop in depoling voltage appears in the conventional curve, which means that higher risk of depoling voltage of the thin film piezoelectric element 100 generates at high temperature. Due to the higher risk, operation voltage of the conventional thin film piezoelectric element 100 must be much lower than the depoling voltage so as to keep safe margin for high temperature operations, which causes the maximum stroke be limited and reduced in turn. In the present invention contrarily, no significant drop appears in the depoling voltage curve under the temperature ranging from −40~125° C., therefore, larger operation voltage of the thin film piezoelectric element 200 is allowed thereby achieving a larger stroke compared with the conventional one.

Figure 4D:
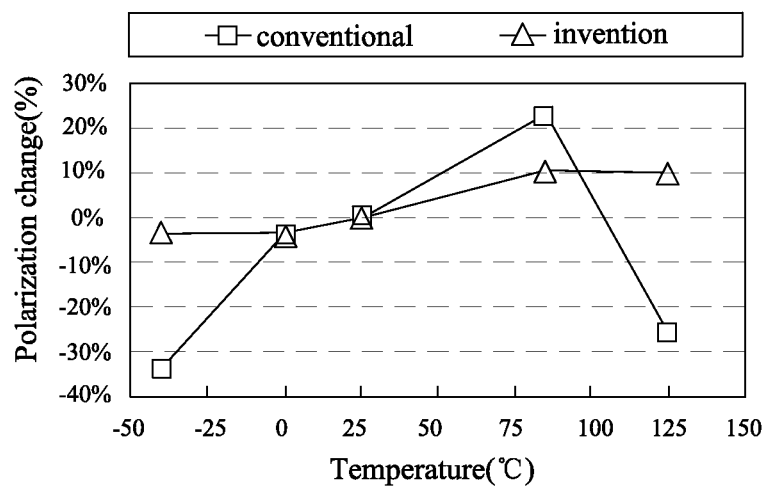
FIG. 4d is a contrast diagram of polarization change between the thin film piezoelectric element of the present invention and the conventional thin film piezoelectric element under a specific temperature range.

FIG. 4d shows a contrast diagram of polarization change between the thin film piezoelectric element 200 of the present invention and the conventional thin film piezoelectric element 100 under a temperature ranging from −40~125° C. It can be seen that, the polarization change in the conventional thin film piezoelectric element 100 is significant, particularly, the polarization of the conventional thin film piezoelectric element 100 drops sharply at both ends of low and high temperatures. In contrast, the polarization is more stable under the variable temperature condition, which possesses good thermal ability and reduces thermal noise.

As other embodiments of the present invention, the first piezoelectric layer 212 and the second piezoelectric layer 213 can be made by $KNaNbO_3$, $LiNbO_3$, $LiTaO_3$, $BaTiO_3$, $PbTiO_3$ or $BaSrTiO_3$ materials, which are not limited, if only the compositions of the two piezoelectric layers 212, 213 have different phase structures.

Figure 5:
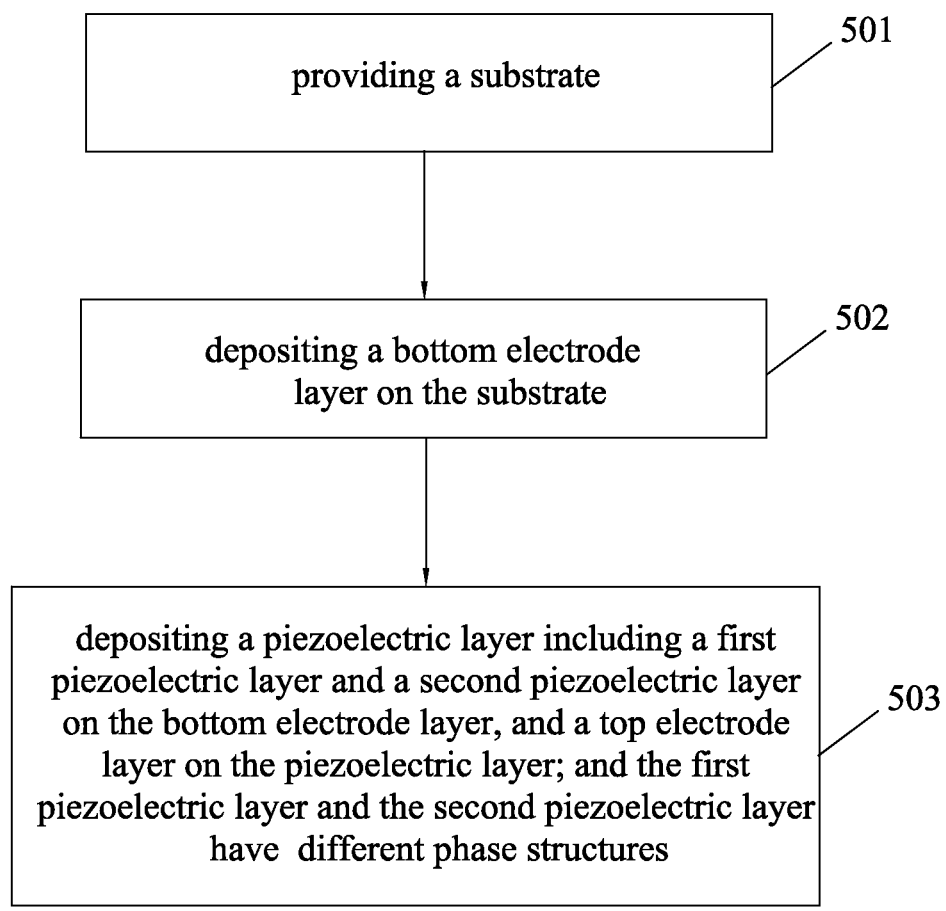
FIG. 5 is a flowchart of a manufacturing method of a thin film piezoelectric element according to one embodiment of the present invention.

FIG. 5 is a flowchart of a manufacturing method of the thin film piezoelectric element 200 according to one embodiment of the present invention. As shown, the manufacturing method includes following steps:

(501), providing a substrate;

(502), depositing a bottom electrode layer on the substrate; and (503), depositing a piezoelectric layer including a first piezoelectric layer and a second piezoelectric layer on the bottom electrode layer, and a top electrode layer on the piezoelectric layer; and the first piezoelectric layer and the second piezoelectric layer have different phase structures.

Concretely, in the step (503), the first piezoelectric layer and the second piezoelectric layer are deposited by two different sputtering targets. As an embodiment, one target has composition of $Pb(Zr_{0.61}Ti_{0.39})O_3$, another target has composition of $Pb(Zr_{0.58}Ti_{0.42})O_3$, as a result, the two piezoelectric layers have different phase structures. Concretely, the first piezoelectric layer and the second piezoelectric layer can be made by special deposition arrangement or post annealing treatment.

The thin film piezoelectric element 200 of the present invention explained above can be used in micro-actuator, sensor etc., or other device. Several applications will be described hereinafter.

Figure 6:
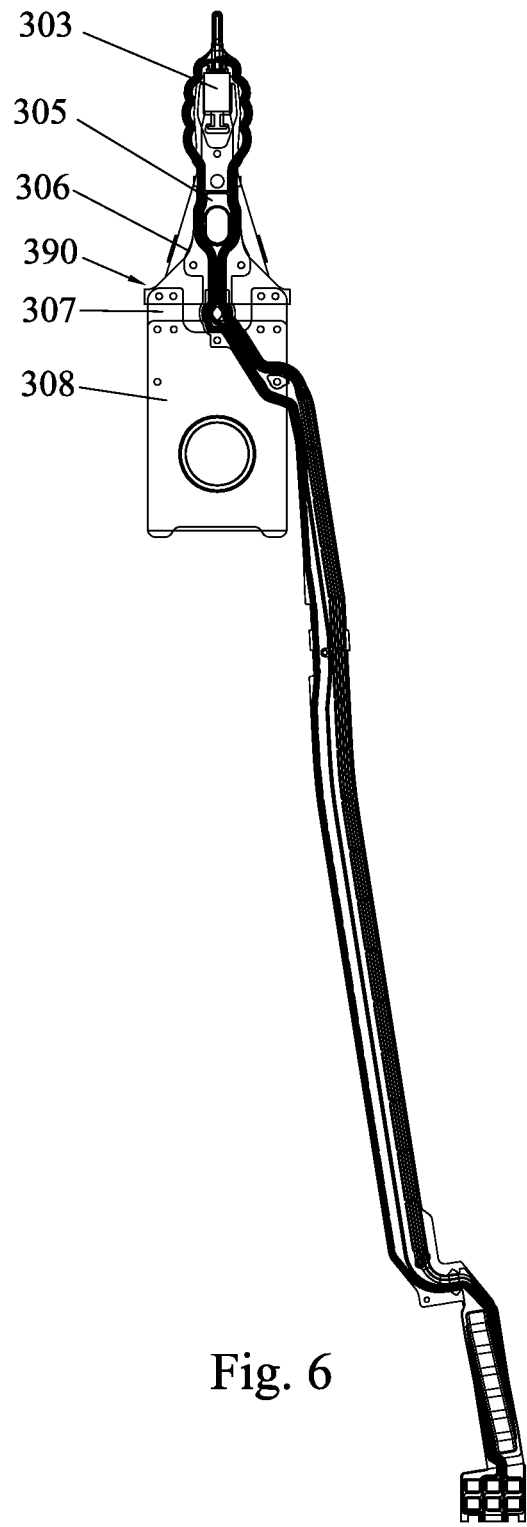
FIG. 6 shows a head gimbal assembly having the thin film piezoelectric element according to one embodiment of the present invention.

As an embodiment, a micro-actuator with the thin film piezoelectric element 200 the present invention can be used in field of the disk drive unit, in order to actuating the slider thereon. FIG. 6 shows a head gimbal assembly (HGA) with such a micro-actuator having the thin film piezoelectric element 200. Referring to FIG. 6, the HGA 300 according to an embodiment of the invention includes a suspension 390 and a slider 303 carried on the suspension 390. The suspension 390 includes a load beam 306, a base plate 308, a hinge 307 and the flexure 305, all of which are assembled with each other. The hinge 307 has a mounting hole (not shown) formed thereon to assemble the hinge 307 to the base plate 308. And then the slider 303 is carried on the flexure 305. It' known that the slider 303 has terminals that are connected to a write element and a read element, which are connected to the write and read terminals. The write element is, for example, a standard induction type magnetic transducer. The read element is a MR element, a GMR element, or a TMR element having a high read sensitivity.

According to actual practice, the micro-actuator with the thin film piezoelectric element 200 (not shown in this figure) are attached on two sides of the slider 303, or mounted on the flexure 305 near the slider 303, so as to actuate the slider 303 with fine movement to achieve a good reading and writing. The thin film piezoelectric element 200 includes the same structures as explained above which are omitted here.

Figure 7:
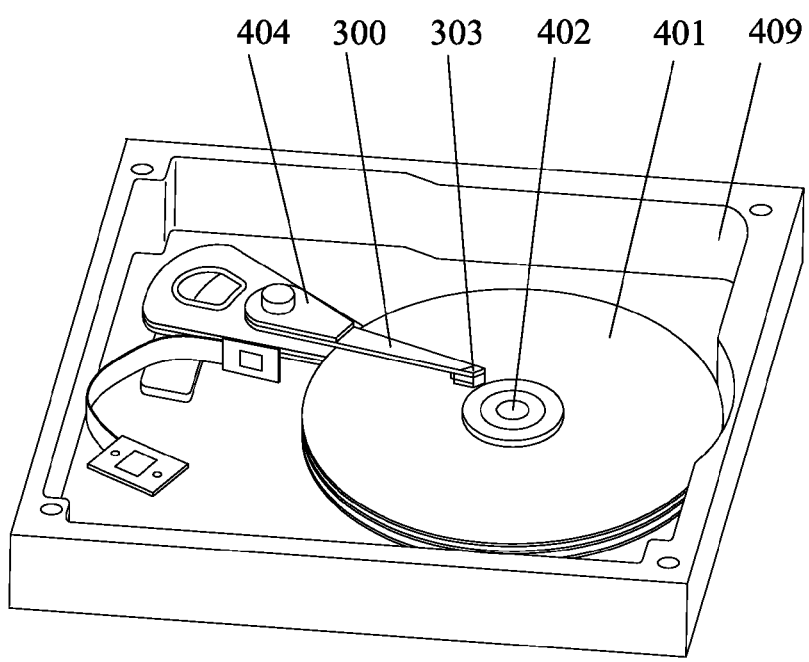
FIG. 7 shows a disk drive unit having the thin film piezoelectric element according to one embodiment of the present invention.

FIG. 7 shows a disk drive unit with the thin film piezoelectric element 200 according to an embodiment of the invention. The disk drive unit 400 includes an HGA 300, a drive arm 404 connected to the HGA 300, a series of rotatable disks 401, and a spindle motor 402 to spin the disk 401, all of which are mounted in a housing 409. The HGA 300 includes a suspension 390 having a flexure 305, a slider 303, and a micro-actuator with the thin film piezoelectric element 200 as mentioned above. Because the structure and/or assembly process of disk drive unit of the present invention are well known to persons ordinarily skilled in the art, a detailed description of such structure and assembly is omitted herefrom.

As mentioned above, because the thin film piezoelectric element 200 has two different phase structures on the compositions of the two piezoelectric layers 212, 213, charge will build up on the two piezoelectric layers 212, 213 when an AC voltage is applied to the thin film piezoelectric element 200, thereby enhancing coercive field strength of the thin film piezoelectric element 200, and in turns enabling larger applied field strength without depolarization and enhancing the piezoelectric constants d31 and d33 accordingly; moreover, the depolarization voltage of the thin film piezoelectric element 200 of the present invention is significantly larger, thereby obtaining a larger stroke and being beneficial to control the movement of the slider 303. As a result, the performance of the disk drive unit 400 is improved accordingly.

The thin film piezoelectric element 200 of the invention present invention also can be used in a micro-electro-mechanical system (MEMS) (not shown), such as actuators, sensors, gyroscopes, accelerators, radio frequency (RF) resonators, or other MEMS devices, due to the larger maximum stroke and good thermal ability. In the MEMS device with such thin film piezoelectric element 200, the larger maximum stroke helps to obtain bigger signal output and lower power consumption, and the good thermal ability can reduce the thermal noise, bias offset or other drifts.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A thin film piezoelectric element comprising:
a substrate; and
a piezoelectric thin film stack formed on the substrate, and the piezoelectric thin film stack comprising a top electrode layer, a bottom electrode layer and a piezoelectric layer sandwiched between the top electrode layer and the bottom electrode layer, wherein the piezoelectric layer comprises a first piezoelectric layer and a second piezoelectric layer whose compositions have different phase structures, the second piezoelectric layer is formed directly on top of the first piezoelectric layer, the top electrode layer is formed directly on top of the second piezoelectric layer, and the bottom electrode layer is formed directly below the first piezoelectric layer,
wherein the piezoelectric layer comprising the first and second piezoelectric layers is formed to have a compositional constitution and physical structure that ensures that (a) stroke of the thin film piezoelectric element is progressively increasable by increasing AC voltage provided to the thin film piezoelectric element up to about 50 volts, at which point depolarization occurs, and (b) in use, the thin film piezoelectric element has a depoling voltage change and a polarization change of no more than +/−10% over a temperature range of −40° C. to 125° C.

2. The thin film piezoelectric element according to claim 1, wherein one of the first piezoelectric layer and the second piezoelectric layer has a rhombohedra phase structure, and the other has a tetragonal phase structure.

3. The thin film piezoelectric element according to claim 1, wherein one of the first piezoelectric layer and the second piezoelectric layer has composition at a morphotropic phase boundary, and the other has a rhombohedra phase structure or a tetragonal phase structure.

4. The thin film piezoelectric element according to claim 1, wherein the piezoelectric layer is made of $Pb(Zr_xTi_{1-x})O_3$.

5. The thin film piezoelectric element according to claim 4, wherein the piezoelectric layer comprises two layers with different Ti compositions respectively.

6. The thin film piezoelectric element according to claim 5, wherein the compositions of the piezoelectric layer comprise step differences in Ti composition which are made by two-layer or multi-layer deposition, or comprise smooth gradient in Ti composition by special deposition arrangement or post annealing treatment.

7. The thin film piezoelectric element according to claim 1, wherein the first piezoelectric layer and the second piezoelectric layer have a thickness in the range of 0.1 μm~1.5 μm.

8. The thin film piezoelectric element according to claim 1, wherein the piezoelectric layer comprises $KNaNbO_3$, $LiNbO_3$, $LiTaO_3$, $BaTiO_3$, $PbTiO_3$ or $BaSrTiO_3$.

9. The thin film piezoelectric element according to claim 1, wherein the piezoelectric layer comprising the first and second piezoelectric layers is formed to have a compositional constitution and physical structure that ensures that in use, the thin film piezoelectric element has a depoling voltage change of about 0% to less than 10%, and a polarization change of −5% to 10%, over a temperature range of −40° C. to 125° C.

10. The thin film piezoelectric element according to claim 1, wherein the piezoelectric layer comprising the first and second piezoelectric layers is formed to have a compositional constitution and physical structure that ensures that stroke of the thin film piezoelectric element, as measured in nm, generally linearly increases by increasing AC voltage provided to the thin film piezoelectric element, over a range of 5-50 volts.

11. The thin film piezoelectric element according to claim 1, wherein the piezoelectric layer comprising the first and second piezoelectric layers is formed to have a compositional constitution and physical structure that ensures that stroke of the thin film piezoelectric element progressively increases from about 8 nm to about 60 nm, by increasing AC voltage provided to the thin film piezoelectric element, over a range of 5-50 volts.

12. The thin film piezoelectric element according to claim 11, wherein the piezoelectric layer comprising the first and second piezoelectric layers is formed to have a compositional constitution and physical structure that ensures that in use, the thin film piezoelectric element has a depoling voltage change of about 0% to less than 10%, and a polarization change of −5% to 10%, over a temperature range of −40° C. to 125° C.

13. A manufacturing method of a thin film piezoelectric element, the method comprising:
providing a substrate;
depositing a bottom electrode layer on the substrate; and
depositing a piezoelectric layer comprising a first piezoelectric layer and a second piezoelectric layer on the bottom electrode layer, and a top electrode layer on the piezoelectric layer; wherein the first piezoelectric layer and the second piezoelectric layer have different phase structures, the second piezoelectric layer is formed directly on top of the first piezoelectric layer, the top electrode layer is formed directly on top of the second piezoelectric layer, and the bottom electrode layer is formed directly below the first piezoelectric layer,
wherein the piezoelectric layer comprising the first and second piezoelectric layers is formed to have a compositional constitution and physical structure that ensures that (a) stroke of the thin film piezoelectric element is progressively increasable by increasing AC voltage provided to the thin film piezoelectric element up to about 50 volts, at which point depolarization occurs, and (b) in use, the thin film piezoelectric element has a depoling voltage change and a polarization change of no more than +/−10% over a temperature range of −40° C. to 125° C.

14. The manufacturing method according to claim 13, wherein one of the first piezoelectric layer and the second piezoelectric layer has a rhombohedra phase structure, and the other has a tetragonal phase structure.

15. The manufacturing method according to claim 13, wherein one of the first piezoelectric layer and the second piezoelectric layer has composition at a morphotropic phase boundary, and the other has a rhombohedra phase structure or a tetragonal phase structure.

16. The manufacturing method according to claim 15, wherein the piezoelectric layer is made of $Pb(Zr_xTi_{1-x})O_3$.

17. The manufacturing method according to claim 16, wherein the piezoelectric layer comprises two layers with different Ti compositions respectively.

18. The manufacturing method according to claim 17, wherein the compositions of the piezoelectric layer comprise step differences in Ti composition which are made by two-layer or multi-layer deposition, or comprise smooth gradient in Ti composition by special deposition arrangement or post annealing treatment.

19. A micro-actuator comprising a thin film piezoelectric element which comprises:
a substrate; and
a piezoelectric thin film stack formed on the substrate, and the piezoelectric thin film stack comprising a top electrode layer, a bottom electrode layer and a piezoelectric layer sandwiched between the top electrode layer and the bottom electrode layer, wherein the piezoelectric layer comprises a first piezoelectric layer and a second piezoelectric layer whose compositions have different phase structures, the second piezoelectric layer is formed directly on top of the first piezoelectric layer, the top electrode layer is formed directly on top of the second piezoelectric layer, and the bottom electrode layer is formed directly below the first piezoelectric layer,
wherein the piezoelectric layer comprising the first and second piezoelectric layers is formed to have a compositional constitution and physical structure that ensures that (a) stroke of the thin film piezoelectric element is progressively increasable by increasing AC voltage provided to the thin film piezoelectric element up to about 50 volts, at which point depolarization occurs, and (b) in use, the thin film piezoelectric element has a depoling voltage change and a polarization change of no more than +/−10% over a temperature range of −40° C. to 125° C.

20. The micro-actuator according to claim 19, wherein one of the first piezoelectric layer and the second piezoelectric layer has a rhombohedra phase structure, and the other has a tetragonal phase structure.

21. The micro-actuator according to claim 19, wherein one of the first piezoelectric layer and the second piezoelectric layer has composition at a morphotropic phase boundary, and the other has a rhombohedra phase structure or a tetragonal phase structure.

22. The micro-actuator according to claim 19, wherein the piezoelectric layer is made of $Pb(Zr_xTi_{1-x})O_3$.

23. The micro-actuator according to claim 22, wherein the piezoelectric layer comprises two layers with different Ti compositions respectively.

24. The micro-actuator according to claim 23, wherein the compositions of the piezoelectric layer comprise step differences in Ti composition which are made by two-layer or multi-layer deposition, or comprise smooth gradient in Ti composition by special deposition arrangement or post annealing treatment.

25. The micro-actuator according to claim 19, wherein the first piezoelectric layer and the second piezoelectric layer has a thickness in the range of 0.1 μm~1.5 μm.

26. The micro-actuator according to claim 19, wherein the piezoelectric layer comprises $KNaNbO_3$, $LiNbO_3$, $LiTaO_3$, $BaTiO_3$, $PbTiO_3$ or $BaSrTiO_3$.

27. A head gimbal assembly comprising a suspension, a slider supported by the suspension, and a thin film piezoelectric element formed on the suspension for actuating the slider, wherein the thin film piezoelectric element comprises:
a substrate; and
a piezoelectric thin film stack formed on the substrate, and the piezoelectric thin film stack comprising a top electrode layer, a bottom electrode layer and a piezoelectric layer sandwiched between the top electrode layer and the bottom electrode layer, wherein the piezoelectric layer comprises a first piezoelectric layer and a second piezoelectric layer whose compositions have different phase structures, the second piezoelectric layer is formed directly on top of the first piezoelectric layer, the top electrode layer is formed directly on top of the second piezoelectric layer, and the bottom electrode layer is formed directly below the first piezoelectric layer,
wherein the piezoelectric layer comprising the first and second piezoelectric layers is formed to have a compositional constitution and physical structure that ensures that (a) stroke of the thin film piezoelectric element is progressively increasable by increasing AC voltage provided to the thin film piezoelectric element up to about 50 volts, at which point depolarization occurs, and (b) in use, the thin film piezoelectric element has a depoling voltage change and a polarization change of no more than +/−10% over a temperature range of −40° C. to 125° C.

28. A disk drive unit, comprising:
a head gimbal assembly;
a drive arm to connect with the head gimbal assembly;
disks; and
a spindle motor to spin the disks;
wherein the head gimbal assembly comprises a suspension, a slider supported by the suspension, and a thin film piezoelectric element formed on the suspension for actuating the slider, wherein the thin film piezoelectric element comprises:
a substrate; and
a piezoelectric thin film stack formed on the substrate, and the piezoelectric thin film stack comprising a top electrode layer, a bottom electrode layer and a piezoelectric layer sandwiched between the top electrode layer and the bottom electrode layer, wherein the piezoelectric layer comprises a first piezoelectric layer and a second piezoelectric layer whose compositions have different phase structures, the second piezoelectric layer is formed directly on top of the first piezoelectric layer, the top electrode layer is formed directly on top of the second piezoelectric layer, and the bottom electrode layer is formed directly below the first piezoelectric layer,
wherein the piezoelectric layer comprising the first and second piezoelectric layers is formed to have a compositional constitution and physical structure that ensures that (a) stroke of the thin film piezoelectric element is progressively increasable by increasing AC voltage provided to the thin film piezoelectric element up to about 50 volts, at which point depolarization occurs, and (b) in use, the thin film piezoelectric element has a depoling voltage change and a polarization change of no more than +/−10% over a temperature range of −40° C. to 125° C.

29. A micro-electro-mechanical system, comprising a thin film piezoelectric element which comprises:
a substrate; and
a piezoelectric thin film stack formed on the substrate, and the piezoelectric thin film stack comprising a top electrode layer, a bottom electrode layer and a piezoelectric layer sandwiched between the top electrode layer and the bottom electrode layer, wherein the piezoelectric layer comprises a first piezoelectric layer and a second piezoelectric layer whose compositions have different phase structures, the second piezoelectric layer is formed directly on top of the first piezoelectric layer, the top electrode layer is formed directly on top of the second piezoelectric layer, and the bottom electrode layer is formed directly below the first piezoelectric layer, wherein the piezoelectric layer comprising the first and second piezoelectric layers is formed to have a compositional constitution and physical structure that ensures that (a) stroke of the thin film piezoelectric element is progressively increasable by increasing AC voltage provided to the thin film piezoelectric element up to about 50 volts, at which point depolarization occurs, and (b) in use, the thin film piezoelectric element has a depoling voltage change and a polarization change of no more than +/−10% over a temperature range of −40° C. to 125° C.

30. The micro-electro-mechanical system according to claim 29, wherein one of the first piezoelectric layer and the second piezoelectric layer has a rhombohedra phase structure, and the other has a tetragonal phase structure.

31. The micro-electro-mechanical system according to claim 29, wherein one of the first piezoelectric layer and the second piezoelectric layer has composition at a morphotropic phase boundary, and the other has a rhombohedra phase structure or a tetragonal phase structure.

32. The micro-electro-mechanical system according to claim 29, wherein the piezoelectric layer is made of $Pb(Zr_xTi_{1-x})O_3$.

33. The micro-electro-mechanical system according to claim 32, wherein the piezoelectric layer comprises two layers with different Ti compositions respectively.

34. The micro-electro-mechanical system according to claim 33, wherein the compositions of the piezoelectric layer comprise step differences in Ti composition which are made by two-layer or multi-layer deposition, or comprise smooth gradient in Ti composition by special deposition arrangement or post annealing treatment.

35. The micro-electro-mechanical system according to claim 29, wherein the first piezoelectric layer and the second piezoelectric layer have a thickness in the range of 0.1 µm~3.0 µm.

36. The micro-electro-mechanical system according to claim 29, wherein the piezoelectric layer comprises $KNaNbO_3$, $LiNbO_3$, $LiTaO_3$, $BaTiO_3$, $PbTiO_3$ or $BaSrTiO_3$.

* * * * *